US009853432B2

United States Patent
Sasaki et al.

(10) Patent No.: US 9,853,432 B2
(45) Date of Patent: Dec. 26, 2017

(54) ELECTRICAL JUNCTION BOX

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LIMITED, Osaka-shi, Osaka (JP)

(72) Inventors: Yoshikazu Sasaki, Mie (JP); Junya Aichi, Mie (JP); Kyungwoo Kim, Mie (JP); Shigeki Yamane, Mie (JP); Takehito Kobayashi, Mie (JP); Yukinori Kita, Mie (JP); Tomohiro Ooi, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LIMITED, Osaka (JP)

( * ) Notice: Subject to any disclaimer, the term of this patent is extended or adjusted under 35 U.S.C. 154(b) by 0 days.

(21) Appl. No.: 15/321,648

(22) PCT Filed: Jun. 30, 2015

(86) PCT No.: PCT/JP2015/068766
§ 371 (c)(1),
(2) Date: Dec. 22, 2016

(87) PCT Pub. No.: WO2016/002748
PCT Pub. Date: Jan. 7, 2016

(65) Prior Publication Data
US 2017/0149223 A1    May 25, 2017

(30) Foreign Application Priority Data

Jul. 2, 2014  (JP) .................................. 2014-136487

(51) Int. Cl.
*H05K 7/06* (2006.01)
*H05K 7/20* (2006.01)
(Continued)

(52) U.S. Cl.
CPC ........... *H02G 3/16* (2013.01); *B60R 16/0239* (2013.01); *H01R 13/6658* (2013.01); *H02G 5/06* (2013.01);
(Continued)

(58) Field of Classification Search
CPC ............ B60R 16/0239; H01R 13/6658; H01R 2201/26
See application file for complete search history.

(56) References Cited

U.S. PATENT DOCUMENTS 6,942,499 B2 * 9/2005 Tanaka ................ B60R 16/0239
439/76.2
7,333,337 B2 * 2/2008 Kita .................... B60R 16/0239
165/104.33
(Continued)

FOREIGN PATENT DOCUMENTS

JP     2003-164039 A     6/2003
JP     2006-050754 A     2/2006
JP     2007-259594 A     10/2007

OTHER PUBLICATIONS

Aug. 18, 2015 International Search Report issued in International Patent Application No. PCT/JP2015/068766.
(Continued)

*Primary Examiner* — Hung V Ngo
(74) *Attorney, Agent, or Firm* — Oliff PLC (57) ABSTRACT

An electrical junction box includes an insulating substrate, a bus bar that is bonded to the insulating substrate, and a reinforcement plate that is bonded to a region of the insulating substrate to which the bus bar is not bonded. The reinforcement plate includes a through hole that allows
(Continued)

passage of a shaft portion of a screw. A heat-dissipating member is stacked on a surface of the reinforcement plate opposite to the insulating substrate, and includes a screw hole into which the screw is screwed. A retaining member retains the respective positions of the insulating substrate, the bus bar, and the reinforcement plate, and the reinforcement plate includes an engagement portion that aligns the through hole and the screw hole by engaging with the retaining member.

8 Claims, 11 Drawing Sheets

(51) Int. Cl.
    *H02G 3/16* (2006.01)
    *H02G 5/06* (2006.01)
    *B60R 16/023* (2006.01)
    *H01R 13/66* (2006.01)
(52) U.S. Cl.
    CPC ........... *H05K 7/06* (2013.01); *H05K 7/20436* (2013.01); *H01R 2201/26* (2013.01)

(56) References Cited

U.S. PATENT DOCUMENTS

| | | | | |
|---|---|---|---|---|
| 7,417,873 B2* | 8/2008 | Kadoya | ............. | B29C 45/14377 257/E21.504 |
| 7,532,458 B2* | 5/2009 | Sasaki | ................. | B60R 16/0239 307/10.1 |
| 7,632,110 B2* | 12/2009 | Kanou | ................ | B60R 16/0239 361/704 |
| 7,697,300 B2* | 4/2010 | Brandt | ............... | B60R 16/0239 361/704 |
| 7,719,833 B2* | 5/2010 | Inagaki | ............... | B60R 16/0239 165/80.3 |
| 7,791,888 B2* | 9/2010 | Tominaga | ........... | B60R 16/0239 165/185 |
| 2003/0137813 A1 | 7/2003 | Lo | | |
| 2003/0161110 A1* | 8/2003 | Spasevski | ........... | B60R 16/0239 361/715 |
| 2010/0254093 A1* | 10/2010 | Oota | ................... | B60R 16/0239 361/720 |
| 2010/0271791 A1* | 10/2010 | Loibl | ................. | B60R 16/0239 361/760 |
| 2015/0165992 A1* | 6/2015 | Scheele | ............... | B60R 16/0239 307/9.1 |
| 2015/0208525 A1* | 7/2015 | Negishi | ................ | H05K 5/0056 361/752 |

OTHER PUBLICATIONS

Aug. 18, 2015 Written Opinion issued in International Patent Application No. PCT/JP2015/068766.

\* cited by examiner

ELECTRICAL JUNCTION BOX

BACKGROUND

Conventionally, an electrical junction box is known in which an insulating substrate and a bus bar board are stacked and fixed to a heat-dissipating member. In Publication JP-A-2003-164039 (P2003-164039A), there are provided (i) a circuit structural body in which a bus bar structural plate constituted by a plurality of bus bars stacked with a printed circuit board and (ii) a case that includes this circuit structural body. Electronic components such as relays or the like are mounted on the printed circuit board, and a heat radiation plate is arranged at a bottom portion of the case. The bus bar structural plate is constituted by many bus bars that correspond to the shape of electroconductive paths. The bus bar structural plate is stacked with a thin printed circuit board, so the strength of the printed circuit board is reinforced.

SUMMARY

Incidentally, it is difficult to sufficiently ensure the strength of the printed circuit board in a region in which a bus bar structural plate is not stacked. Thus, there is a concern that it may be deformed due to the heat of soldering. Meanwhile, to control deformation or the like of the printed circuit board, it is conceivable that the printed circuit board can be reinforced by stacking a reinforcement plate at a position of the printed circuit board at which the bus bar structural plate is not stacked. In this case, it is desirable that not only the printed circuit board can be reinforced, but also that the printed circuit board can easily be positioned with respect to the heat radiation plate.

This invention was completed based on the above situation. An object of this invention is to reinforce an insulating substrate and easily position the insulating substrate with respect to a heat-dissipating member.

An electrical junction box of this invention is provided with (i) an insulating substrate having an electroconductive path formed on an insulating plate, (ii) a bus bar that is bonded to the insulating substrate and forms an electroconductive path, (iii) a reinforcement plate that is bonded to a region of the insulating substrate to which the bus bar is not bonded, the reinforcement plate having formed therein a through hole through which a shaft portion of a screw is passed, (iv) a terminal that is soldered to the insulating substrate, (v) a heat-dissipating member that is stacked on a surface of the reinforcement plate on the opposite side from the insulating substrate, the heat-dissipating member having formed therein a screw hole into which the screw is threaded; and (vi) a retaining member that retains the respective positions of the insulating substrate, the bus bar, and the reinforcement plate, wherein the reinforcement plate is provided with an engagement portion that aligns the through hole and the screw hole by engaging with the retaining member.

According to this structure, the through hole and the screw hole are aligned by the engagement portion of the reinforcement plate being engaged with the retaining member. Thus, in this state, if the reinforcement plate is screwed to the heat-dissipating member, the position of the insulating plate with respect to the heat-dissipating member can be fixed through the reinforcement plate. Thus, while reinforcing the insulating plate, the insulating plate can easily be positioned with respect to the heat-dissipating member.

The following mode is preferred as an embodiment of this invention.

The engagement portion is arranged in the vicinity of the through hole.

Thus, accuracy of alignment can be increased.

The engagement portion is formed by cutting out a periphery of the reinforcement plate.

Thus, the shape of the engagement portion can be simplified.

The retaining member is provided with an engagement pin that engages with the engagement portion.

Thus, the engagement portion can be easily engaged with the retaining member.

The heat-dissipating member is provided with a receiving portion through which the engagement pin is passed.

Thus, by having the engagement pin pass through the receiving portion of the heat-dissipating member, the engagement pin can be suppressed from contacting the heat-dissipating member even if a protrusion dimension of the engagement pin is made large. Thus, the protrusion dimension of the engagement pin can be made large, and the engagement pin can easily engage with the engagement portion.

The reinforcement plate is provided with a protruding piece that is fit into the retaining member in the vicinity of the through hole.

The insulating substrate is provided with a terminal insertion hole into which the terminal is inserted and soldered, and the reinforcement plate is arranged along an edge of a substrate exposure area at which the bus bar is not stacked, in a region including the terminal insertion hole in the insulating substrate.

A position along the edge of the substrate exposure area in which the bus bar cannot be stacked on the insulating substrate, in order to insulate the bus bar from the outside, can be reinforced by the reinforcement plate.

The terminal comprises a plurality of terminals. A terminal module is provided in which the terminals are connected by a connecting member. The connecting member contacts a surface on an opposite side to a surface on which the reinforcement plate of the insulating substrate is stacked.

According to this invention, the insulating substrate can be easily positioned with respect to the heat-dissipating member while the insulating substrate is reinforced.

DETAILED DESCRIPTION OF EMBODIMENTS

Embodiment

An embodiment is explained with reference to FIGS. 1-11.

Figure 3:
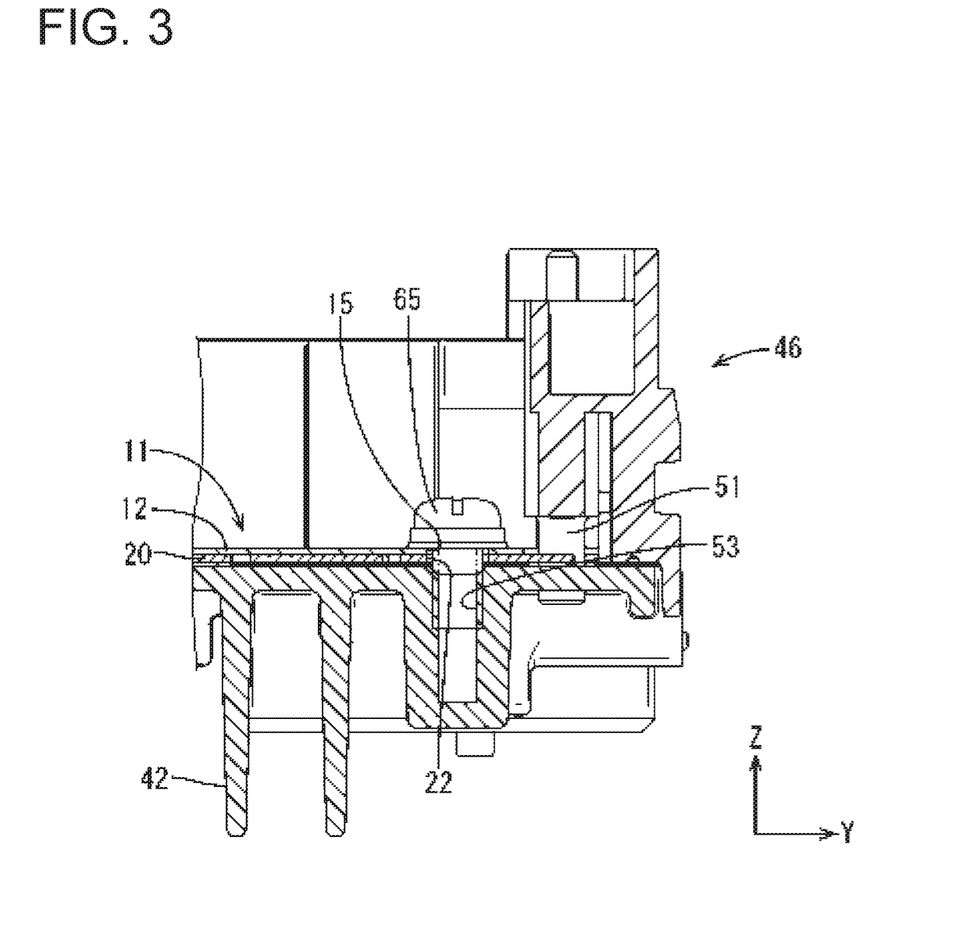
FIG. 3 is a cross-sectional view at line A-A of FIG. 2.
Figure 6:
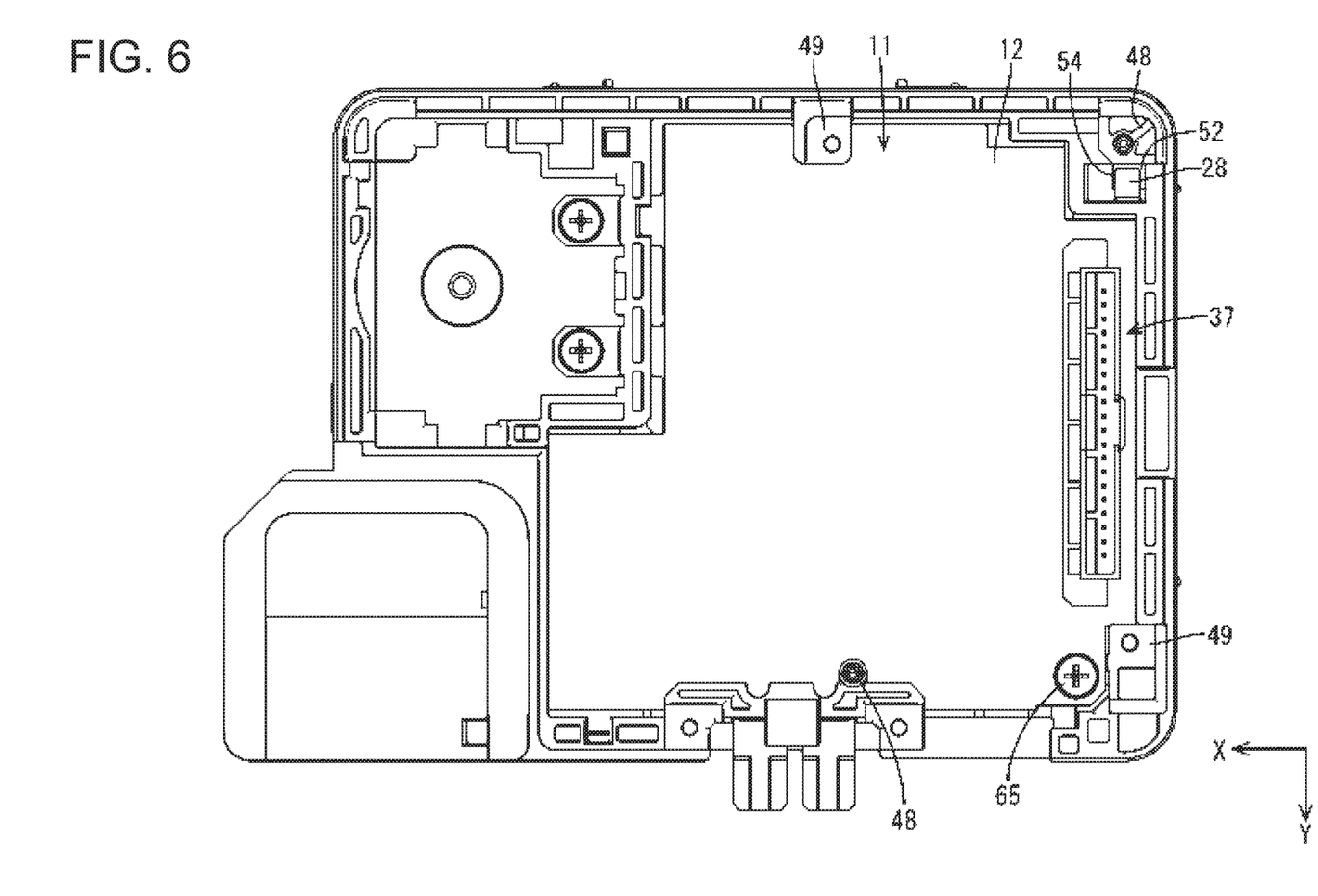
FIG. 6 is a plan view showing a state in which a circuit board and a retaining member are mounted to a heat-dissipating member.

An electrical junction box 10 is arranged, for example, on a power supply path between (i) a power source such as a battery or the like of a vehicle such as an electric vehicle, a hybrid vehicle, or the like and (ii) a load constituted by an onboard electronic component such as a lamp or the like, or a drive motor or the like, and can be used for, for example, a DC-DC converter, an inverter, or the like. Hereafter, for explanation purposes, the directions of FIG. 3 are used as a reference for an upward/downward direction (Z axis) and a rightward/leftward direction (Y axis). For a forward/backward direction (X axis), the leftward direction of FIG. 6 is used as a forward direction, and the rightward direction of FIG. 6 is used as a backward direction.

(Electrical Junction Box 10)

Figure 1:
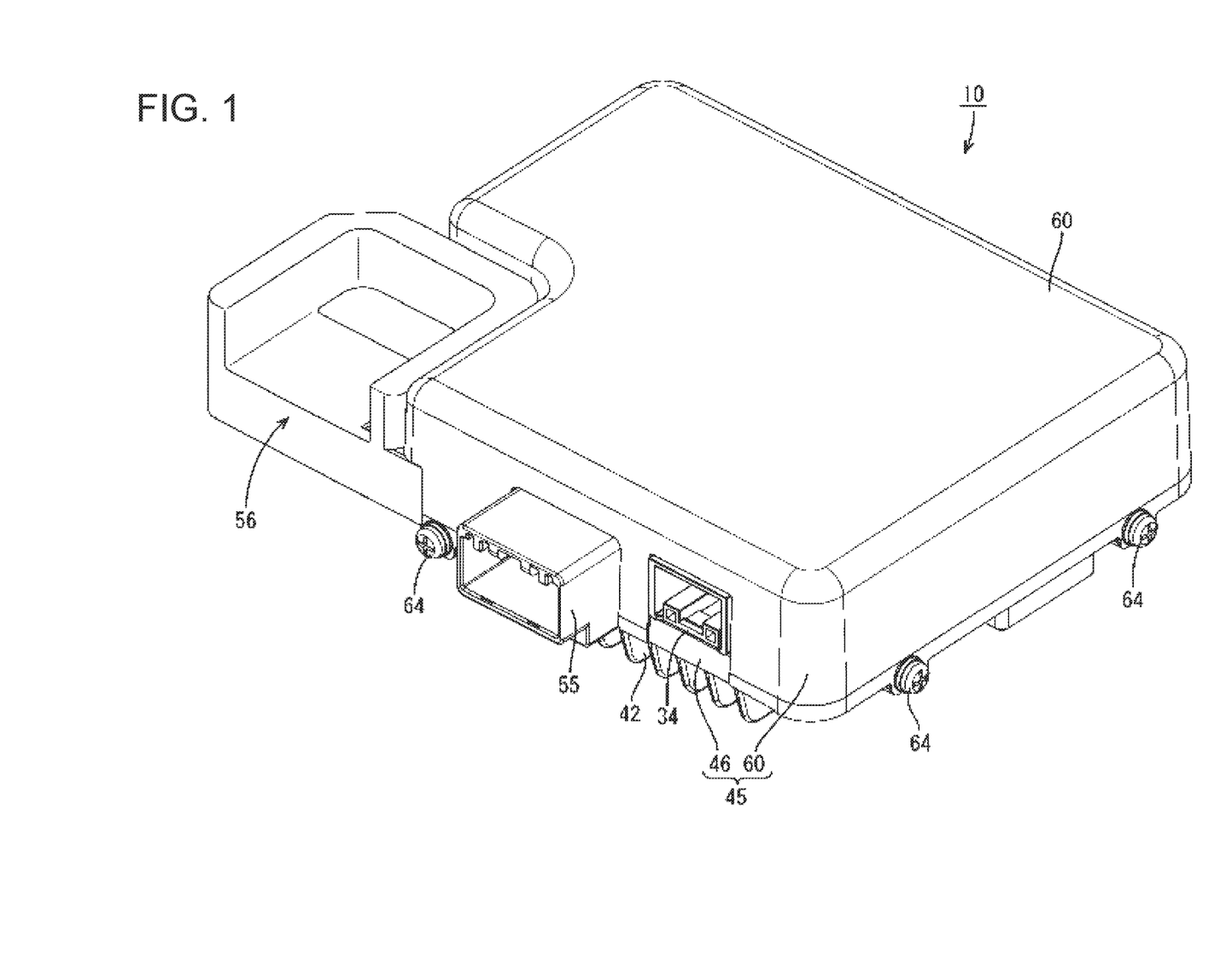
FIG. 1 is a perspective view showing an electrical junction box of an embodiment.
Figure 4:
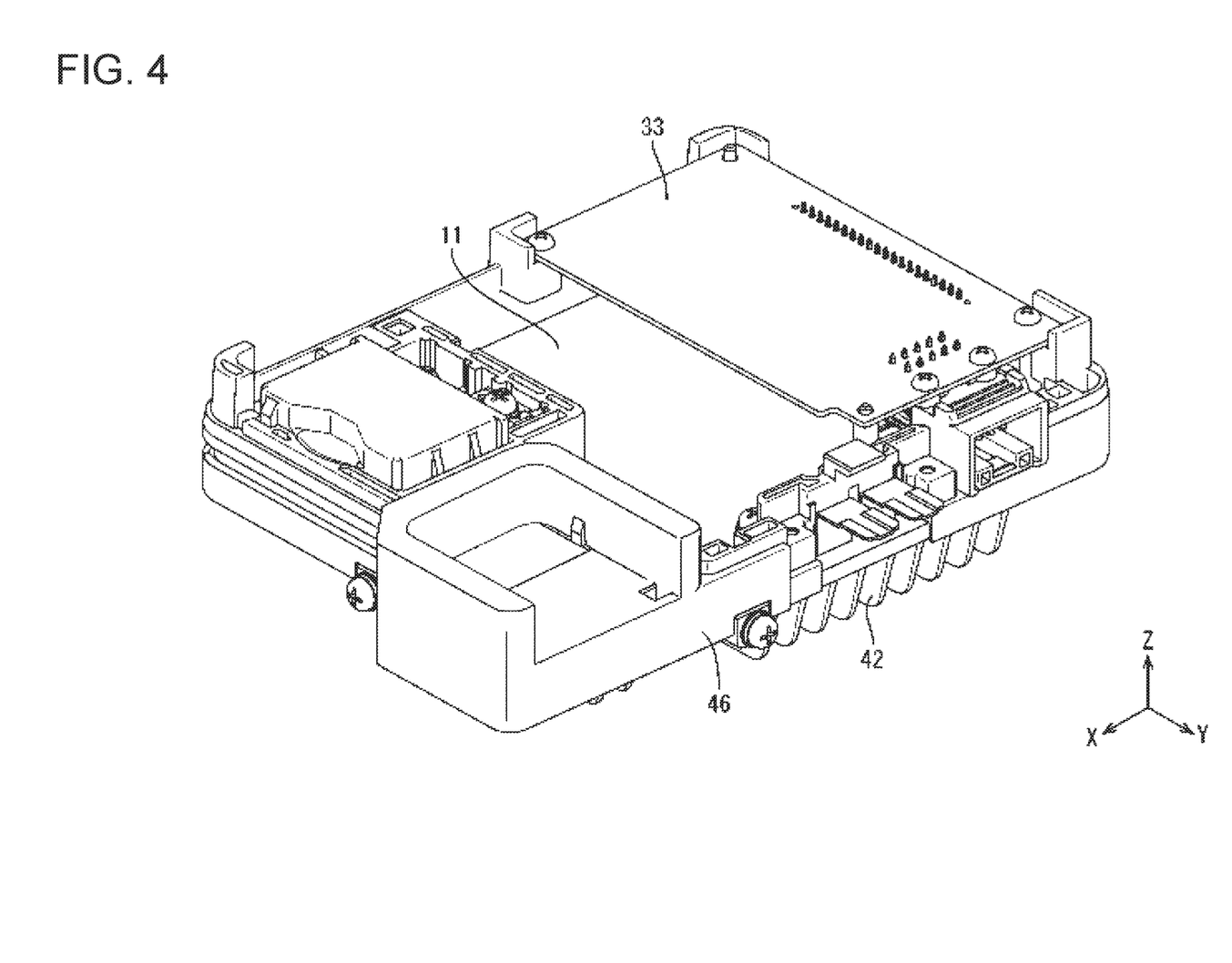
FIG. 4 is a perspective view showing a state in which a shielding cover of the electrical junction box is removed.

As shown in FIGS. 1 and 4, an electrical junction box 10 is provided with (i) a circuit board 11, (ii) a control circuit board 33 that is arranged facing and spaced from the circuit board 11, (iii) a heat-dissipating member 42 on which the circuit board 11 is mounted and which dissipates heat to the outside, and (iv) a case 45 that houses the circuit board 11 and the control circuit board 33 between the case 45 and the heat-dissipating member 42.

(Circuit Board 11)

Figure 7:
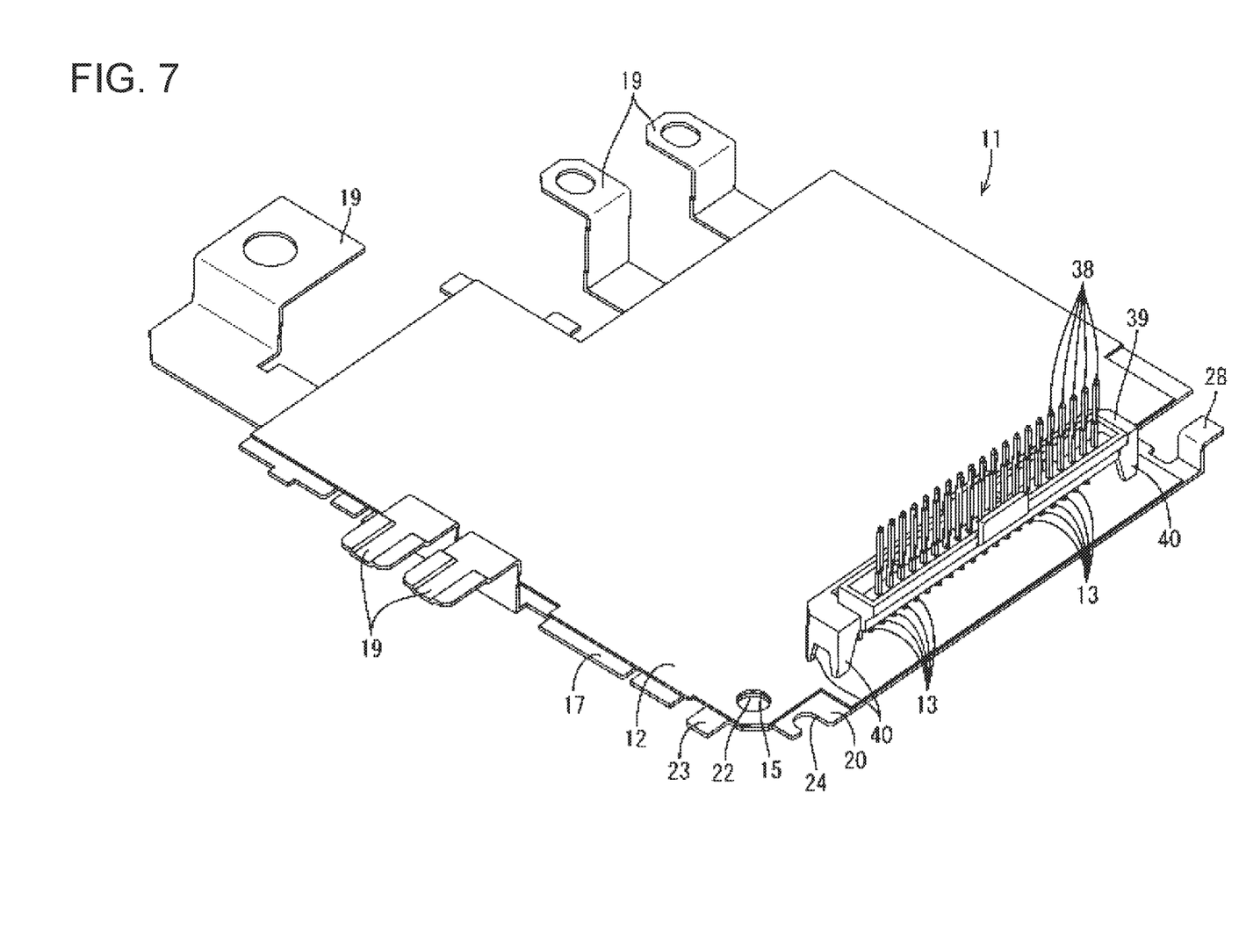
FIG. 7 is a perspective view showing the circuit board.
Figure 8:
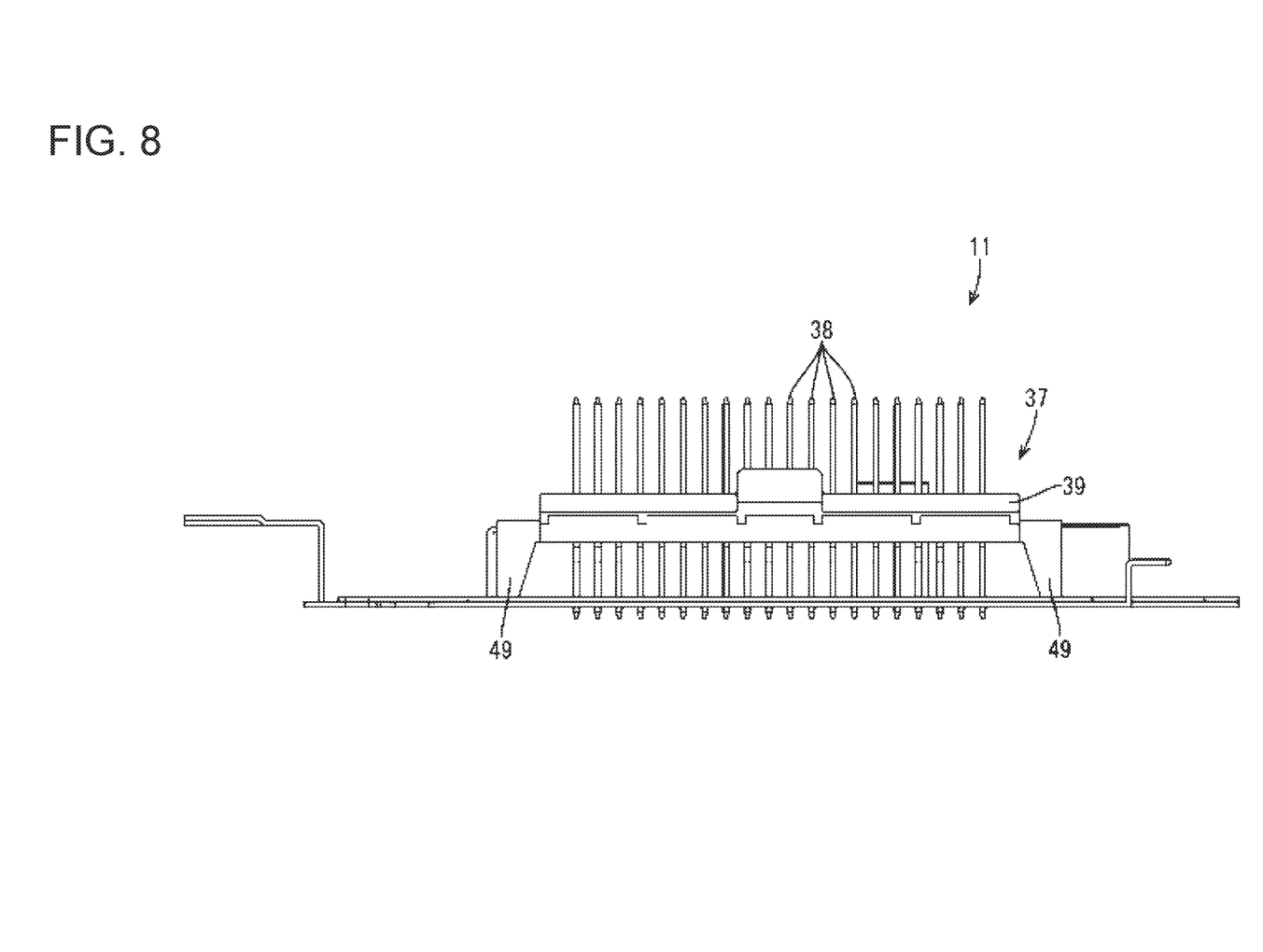
FIG. 8 is a rear view showing the circuit board.
Figure 9:
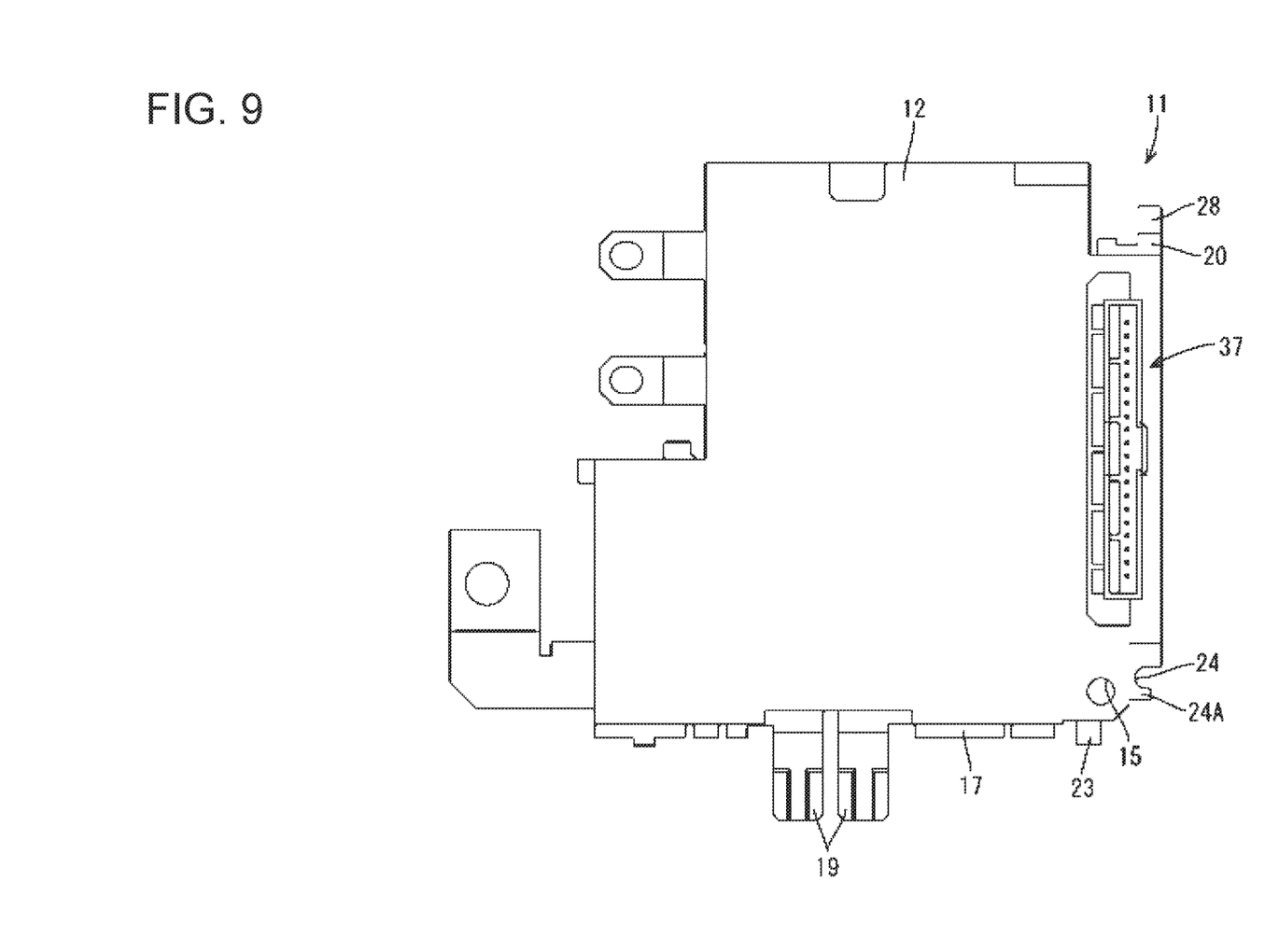
FIG. 9 is a plan view showing the circuit board.

As shown in FIG. 7, the circuit board 11 is rectangular, and an undepicted electronic component is mounted on an undepicted electroconductive path. The electronic component is constituted by a switching element such as an FET (Field Effect Transistor), a capacitor, or the like. The circuit board 11 is provided with (i) an insulating substrate 12, (ii) a bus bar board 17 that is stacked on the insulating substrate 12, and (iii) a reinforcement plate 20 that is stacked in the insulating substrate 12 at a position different from the bus bar board 17.

(Insulating Substrate 12)

The insulating substrate 12 is rectangular, and an electroconductive path constituted by copper foil or the like is formed on an insulating plate formed by an insulating material, using a printed circuit technology. Through the insulating substrate 12 there are formed (i) a plurality of terminal insertion holes 13 through which terminals 38 of a terminal module 37 are passed, (ii) a component insertion hole (undepicted) for connecting a lead terminal of an electronic component to the bus bar board 17, and (iii) a through hole 15 through which is passed a shaft portion of a metal screw 65 for screwing into the heat-dissipating member 42.

Each terminal insertion hole 13 is aligned on an electroconductive path of the insulating substrate 12, and multiple terminal insertion holes 13 are formed so as to be aligned in a row. Multiple component insertion holes are formed corresponding to the positions of the lead terminals 38 of the electronic component and include (i) holes having a large area that allow passage of a bottom surface of the electronic component and (ii) holes having a small area that allow passage of the lead terminals only. There is a plurality of through holes 15 (only one through hole is shown in FIG. 7, and other through holes are not depicted). Each through hole has a round shape that allows passage of the shaft portion of the screw 65, and is arranged at a position of a peripheral portion or a corner of the insulating substrate 12.

(Bus Bar Board 17)

The bus bar board 17 is constituted by a plurality of plate-shaped bus bars 17A (see FIG. 11) formed by punching out a metal plate formed of a copper alloy or the like according to the shape of the electroconductive path and is fixed by bonding to a lower surface of the insulating plate 12, with spaces between the respective bus bars 17A. In the bus bars 17A of the bus bar board 17, which overlap through holes (undepicted) of the insulating substrate 12, through holes (undepicted) are formed through which screws (undepicted) for screw-fastening are passed. As shown in FIG. 7, end portions of the bus bar board 17 are bent in a crank shape and form connecting terminals 19 that are connected to (i) undepicted power source terminals, output terminals and/or a coil.

(Reinforcement Plate 20)

Figure 11:
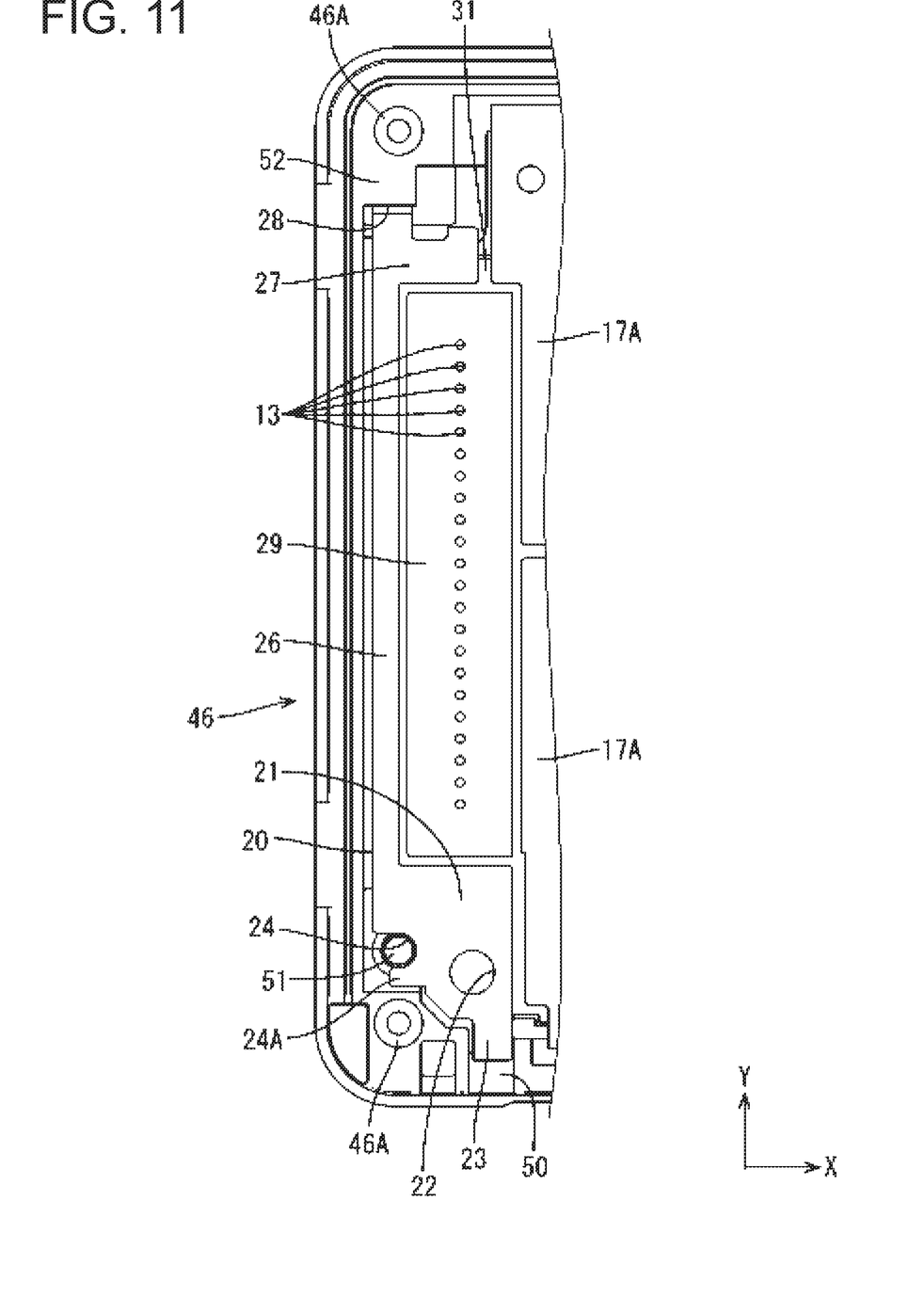
FIG. 11 is a bottom view showing a state in which the circuit board is fit to the retaining member.

As shown in FIG. 11, the reinforcement plate 20 (i) has a long plate shape, in a direction in which the multiple terminal insertion holes 13 are aligned, overlapping a rear end portion (left end portion of FIG. 11) of the insulating substrate 12, (ii) is arranged such that there is space between the bus bars 17A and the reinforcement plate 20, with a substrate exposure area 29 at which a rear surface of the insulating substrate 12 is exposed being between the reinforcement plate 20 and the bus bars 17A, and (iii) is fixed and bonded to the lower surface of the insulating substrate 12, using adhesive. This reinforcement plate 20 is provided with (i) a fixing portion 21 that is arranged at one end portion side in a direction in which the terminals 38 are aligned and is screwed and fixed to the heat-dissipating member 42 by the screw 65, (ii) a narrow portion 26 in which a width dimension is reduced from that of the fixing portion 21 and which extends along an edge of the substrate exposure area 29, and (iii) a wide portion 27 that is arranged at the other end portion side in a direction in which the terminals 38 are aligned and in which the width dimension is increased from that of the narrow portion 26.

The fixing portion 21 is provided with (i) a round through hole 22 through which the shaft portion of the screw 65 having a head portion and a shaft portion is passed, (ii) a protruding piece 23 that is fit into a concave portion 50 at the bottom surface of the case 45, and (iii) an engaging portion 24 whose edge is cut out in a concave shape and which engages an engagement pin 51 of the case 45.

The through hole 22 is formed in the vicinity of the engagement portion 24. Specifically, the through hole 22 is arranged (i) at a position close to the front edge in the forward/backward direction (X axis) at a side opposite to the engagement portion 24 and (ii) slightly toward the protruding piece 23 side from the engagement portion 24 (one end portion in the direction in which the terminals 30 are aligned), in the rightward/leftward direction (Y axis). The protruding piece 23 is positioned in the vicinity of the through hole 22 and is arranged at one end portion of the reinforcement plate 20 in the direction in which the terminals 38 are aligned. When the circuit board 11 is mounted to the case 45, the protruding piece 23 is accommodated in the concave portion 50 that is formed at the bottom surface of the case 45. The outer peripheral portion of the reinforcement plate 20 from the base end of the protruding piece 23 to the engagement portion 24 is cut out corresponding to the bottom surface shape of the case 45.

The engagement portion 24 has a shape in which the rear end portion of the fixing portion 21 is cut out in a semicircular shape. At the edge of the engagement portion 24, there is a receiving portion 24A that protrudes rearwardly at the protruding piece 23 side and which receives the engagement pin 51. The narrow portion 26 extends in the rightward/leftward direction at a fixed width dimension. The wide portion 27 is provided with an engagement-receiving portion 28 that is engaged to the case 45. The engagement-receiving portion 28 stands in a crank shape from the plate surface of the reinforcement plate 20 and extends sideways at a level stepped up from the plate surface of the reinforcement plate 20.

The periphery of the terminal through holes 13 at the rear surface of the insulating substrate 12 is defined as the substrate exposure area 29 at which the bus bar board 17 and the reinforcement plate 20 are not overlapping and at which the rear surface of the insulating substrate 12 is exposed and soldered. The substrate exposure area 29 extends along a direction in which the multiple terminals 38 are aligned and is formed with a fixed width dimension.

The insulating substrate 12 is bonded to the bus bar board 17 and the reinforcement plate 20, using insulative adhesive 31. The adhesive 31 is used to bond between (i) the entirety of the insulating substrate 12 and the bus bar board 17, except for the component through holes and the substrate exposure area 29, and (ii) the insulating substrate 12 and the reinforcement plate 20.

(Control Circuit Board 33)

Figure 5:
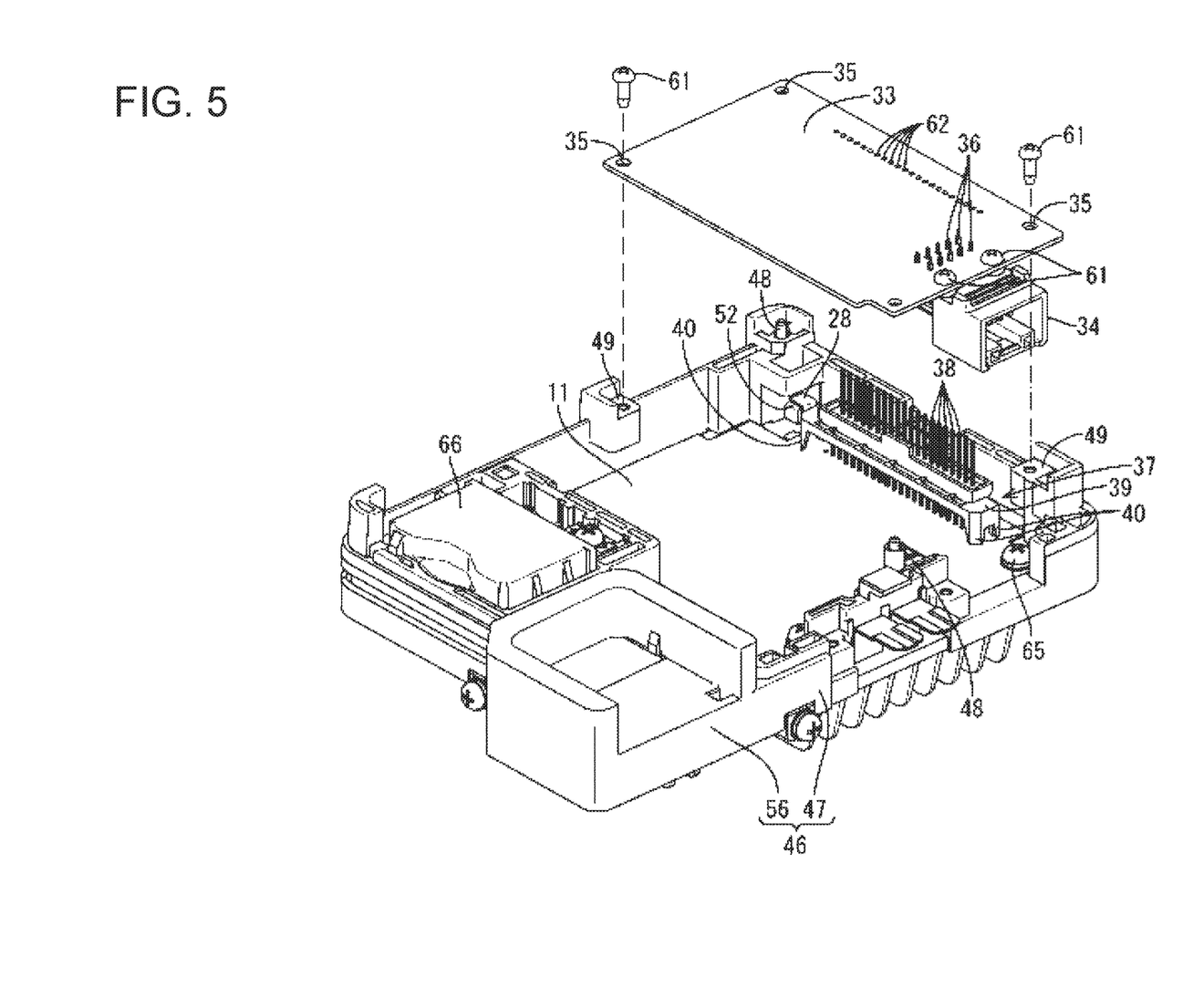
FIG. 5 is a perspective view showing assembly of a control circuit board to a retaining member.

As shown in FIG. 5, the control circuit board 33 has a rectangular shape having an area smaller than that of the circuit board 11, and an electroconductive path formed of copper foil or the like is arranged by printing on an insulating plate formed of an insulating material. With respect to the control circuit board 33, the upper ends of the terminals 38 of the terminal module 37 are passed through holes 62 and are soldered, and a control housing 34 is screwed and fixed, using screws 61. The control housing 34 is of synthetic resin, is opened in a rectangular tube shape that can be fit to another connector housing, and has L-shaped control terminals 36 fixed therein. Electroconductive paths of the circuit board 11 and electroconductive paths of the control circuit board 33 are connected by the multiple terminals 38 of the terminal module 37.

(Terminal Module 37)

The terminal module 37 is provided with (i) the multiple terminals 38 aligned in a row and (ii) a connecting member 39 that connects the multiple terminals 38. Each of the terminals 38 is formed of copper, a copper alloy, or the like and has the same shape. The connecting member 39 is of an insulative synthetic resin, is fixed to multiple terminals 38, and is provided with legs 40 mounted on the circuit board 11.

(Heat-Dissipating Member 42)

Figure 2:
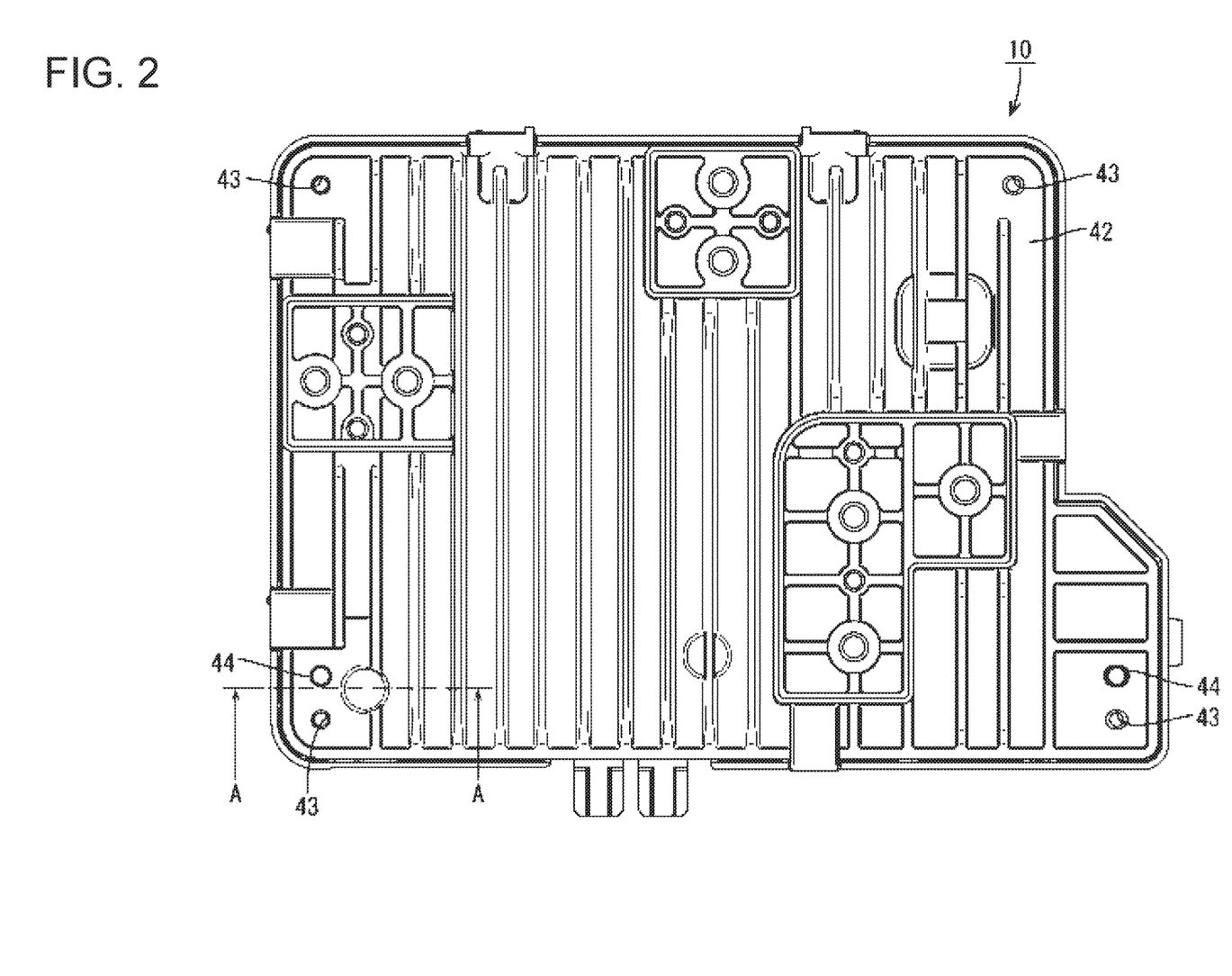
FIG. 2 is a bottom view showing the electrical junction box.

The heat-dissipating member 42 is formed of a metal material having high heat conductivity such as an aluminum alloy, a copper alloy, or the like. As shown in FIGS. 2 and 3, an upper surface side is flat, and a lower surface side has many heat-dissipating fins aligned. In the upper surface of the heat-dissipating member 42, a screw hole 53 into which the screw 65 can be screwed is formed to a downward position at a specified depth, and aligned with the through hole 15 of the insulating substrate 12 and the through hole 22 of the reinforcement plate 20. By fixing the screw 65 to the heat-dissipating member 42 from the top of the insulating substrate 12, with the insulating substrate 12 and the reinforcement plate 20 sandwiched between the screw 65 and the heat-dissipating member 42, positions of the insulating substrate 12, the reinforcement plate 20, and the heat-dissipating member 42 are fixed.

Additionally, in the heat-dissipating member 42, a plurality of through holes 43 for screw-fastening to a retaining member 46 are formed so as to pass through at four corner positions.

(Case 45)

As shown in FIG. 1, the case 45 is provided with (i) the retaining member 46, which is formed of synthetic resin and is mounted on the top surface of the heat-dissipating member 42, and (ii) a metal shielding cover 60 that is mounted on the retaining member 46.

(Retaining Member 46)

As shown in FIG. 5, the retaining member 46 is provided with (i) a frame-shaped frame portion 47 that is arranged along the periphery of the heat-dissipating member 42 and retains the circuit substrate 11 and the control circuit board 33 inside of the frame portion 47 and (ii) a mounting portion 56 that is arranged outside of the shielding cover 60, and to which can be mounted terminal portions of electric wires connected to an undepicted external power source. The frame portion 47 is separated from a portion in which a choke coil 66 is housed.

Substrate fixing portions 48, 49 to which the four corners of the control circuit board 33 are fixed are provided at an upper portion of the frame portion 47. A pair of substrate fixing portions 48 arranged opposite to each other is provided with convex portions that pass through through holes 35 of the control circuit board 33. In the other pair of substrate fixing portions 49, screw holes are formed into which the screws 61 can be screwed via other through holes 35 of the control circuit board 33.

Figure 10:
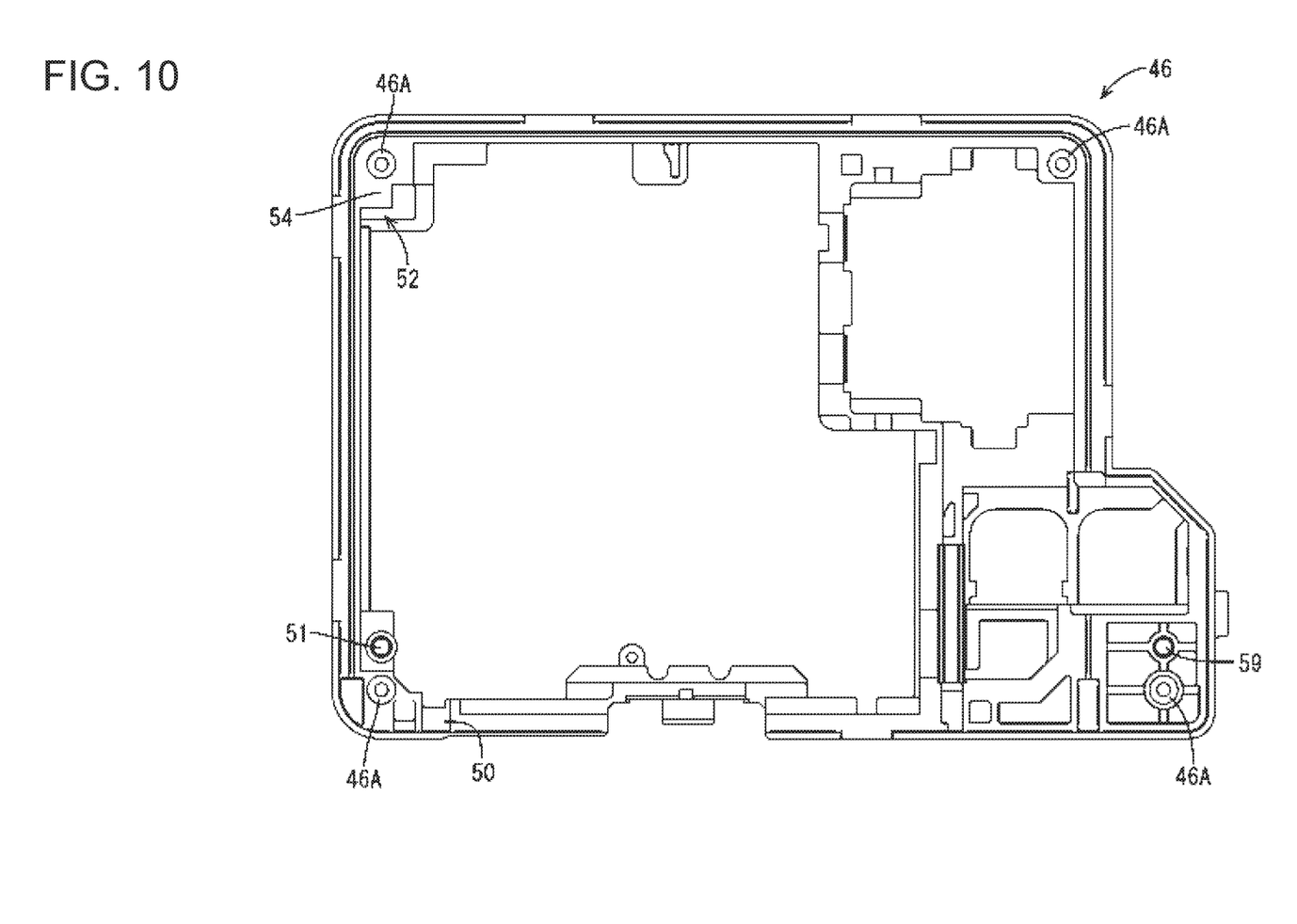
FIG. 10 is a bottom view showing the retaining member.

The circuit board 11 can be mounted to the bottom surface (rear surface) side of the frame portion 47. As shown in FIGS. 10 and 11, the bottom surface side of the frame portion 47 is provided with (i) the concave portion 50 through which the protruding piece 23 of the reinforcement plate 20 passes, (ii) the engagement pin 51 that engages the engagement portion 24, and (iii) an engagement portion 52 that engages the engagement-receiving portion 28.

The concave portion 50 forms a groove shape that extends in a direction in which the protruding piece 23 protrudes. The engagement pin 51 forms a cylindrical bar shape that stands in a perpendicular direction from the bottom surface of the frame portion 47. The engagement pin 51 can be positioned as the outer circumferential surface of the round shape slidably contacts the engagement portion 24. Additionally, the engagement pin 51 is inserted through a receiving portion 44 that passes through the heat-dissipating member 42 (the receiving portion 44 alternatively can be arranged in an upper surface of the heat-dissipating member in a concave shape). A guide pin that has the same shape as the engagement pin 51 and is formed at the end portion opposite to the engagement pin 51 on the rear surface of the retaining member 46 is inserted through another receiving portion 44. These pins can guide the movement in an assembly direction when the retaining member 46 is assembled. The engagement portion 52 is an upper surface of a bottom surface portion 54 that is arranged in a plate shape in a horizontal direction at the bottom surface of the frame portion 47 (see FIG. 6). The position on the circuit board 11 at the engagement portion 52 side is retained.

At the rear surface of the retaining member 46, multiple boss portions 46A for screw-fastening undepicted screws, which pass through the through holes 43 from the heat-dissipating member 42 side, to the retaining member 46 are formed at four corners. The boss portions 46A are provided with screw holes, and relative positions of the retaining member 46 and the heat-dissipating member 42 are fixed by screw-fastening to the boss portions 46A.

As shown in FIG. 1, the mounting portion 56 separates a terminal connected to the power source side from the outside. Power from the external power source is supplied to the circuit board 11 via the terminal in the mounting portion 56. A connector housing 55 in which the connecting terminals 19 are arranged is mounted adjacent to the control housing 34.

(Shielding Cover 60)

The shielding cover 60 is formed by performing punching and bending processing of plate-shaped metal formed of aluminum or the like. A lower end portion is fixed to the heat-dissipating member 42 by being screw-fastened to the heat-dissipating member 42 by screws 64. The shielding cover 60 is also connected to a ground via the heat-dissipating member 42.

Assembly of the electrical junction box 10 will be explained.

The circuit board 11 is formed by applying adhesive 31 to the insulating substrate 12, and stacking the bus bar board 17 and the reinforcement plate 20. The terminal module 37 is mounted to the circuit board 11, and lower end portions of the multiple terminals 38 that are passed through the terminal through holes 13 of the circuit board 11 are flow-soldered (FIG. 7).

Next, when the engagement pin 51 of the retaining member 46 is positioned in the engagement portion 24 of the circuit board 11 and the engagement portion 24 is engaged with the engagement pin 51, and when the protruding piece 23 is fit into the concave portion 50 of the retaining member 46, the circuit board 11 is fit to the bottom surface of the frame portion 47 (FIG. 11).

Next, when the heat-dissipating member 42 is arranged at the rear side of the retaining member 46 to which the circuit board 11 is fit, the engagement pin 51 and the guide pin are inserted through the receiving portions 44 of the heat-dissipating member 42, and the heat-dissipating member 42 is fit to the circuit board 11 and the retaining member 46, the screw hole 53 of the heat-dissipating member 42 overlaps the through hole 15 of the insulating substrate 12 and the through hole 22 of the reinforcement plate 20. Additionally, the screw 65 is passed through the through holes 15, 22 from the top surface side of the circuit board 11, and screw-fastens the circuit board 11 to the screw hole 53 of the heat-dissipating member 42 (FIG. 3), and the heat-dissipating member 42 is screw-fastened to the retaining member 46 via the through holes 43 from the rear surface side of the heat-dissipating member 42.

Next, the control circuit board 33 is screw-fastened to the substrate fixing portions 48, 49, and the top end portions of the multiple terminals 38 are flow-soldered (FIG. 4). Additionally, the electrical junction box 10 is formed by covering the assembly with the shielding cover 60 and screw-fastening it to the heat-dissipating member 42 with the screws 64 (FIG. 1).

Operations and effects of this embodiment will be explained.

The electrical junction box 10 is provided with (i) the insulating substrate 12 having electroconductive paths formed on an insulating plate, (ii) the bus bars 17A that are bonded to the insulating substrate 12 and form the electroconductive paths, (iii) the reinforcement plate 20 that is bonded to a region of the insulating substrate at which the bus bars 17A are not bonded, the reinforcement plate 20 having formed therein a through hole 22 through which a shaft portion of a screw 65 is passed, (iv) the terminals 38 that are soldered to the insulating substrate 12, (v) the heat-dissipating member 42 that is stacked on a surface of the reinforcement plate 20 on the side opposite to the insulating substrate 12, the heat-dissipating member 42 having formed therein a screw hole 53 into which the screw 65 is screwed; and (vi) the retaining member 46 that retains the respective positions of the insulating substrate 12, the bus bars 17A, and the reinforcement plate 20, wherein the reinforcement plate 20 is provided with an engagement portion 24 that positions the through hole 22 and the screw hole 53 by engaging with the retaining member 46.

According to this embodiment, the insulating substrate 12 can be reinforced by the reinforcement plate 20. Thus, deformation of the insulating substrate 12 due to heat when the terminals 38 are soldered can be suppressed. Furthermore, the engagement portion 24 of the reinforcement plate 20 is engaged to the retaining member 46, whereby the through hole 22 and the screw hole 53 are positioned. Thus, in this state, if the reinforcement plate 20 is screw-fastened to the heat-dissipating member 42, the position of the insulating plate 12 with respect to the heat-dissipating member 42 can be fixed through the reinforcement plate 20. Thus, while reinforcing the insulating plate 12, the insulating plate 12 can easily be positioned with respect to the heat-dissipating member 42.

Additionally, the engagement portion 24 is arranged in the vicinity of the through hole 22. Thus, accuracy of positioning can be increased.

Furthermore, the engagement portion 24 is formed so as to cut out the periphery of the reinforcement plate 20. Thus, the shape of the engagement portion 24 can be simplified.

Furthermore, the retaining member 46 is provided with the engagement pin 51 that engages with the engagement portion 24. Thus, the engagement portion 24 can easily be engaged with the retaining member 46.

Additionally, the reinforcement plate 20 is provided with the protruding piece 23 that is fit to the retaining member 46 in the vicinity of the through hole 22. Thus, positioning in a direction (frontward/backward direction) perpendicular to a direction (rightward/leftward direction) in which multiple terminals 38 are aligned can be performed.

Furthermore, having the engagement pin 51 pass through the receiving portion 44 of the heat-dissipating member 42 suppresses the engagement pin 51 from contacting the heat-dissipating member 42 even if the protrusion dimension of the engagement pin 51 is increased. Thus, the protrusion dimension of the engagement pin 51 can be increased, making it possible for the engagement pin 51 to easily engage with the engagement portion 24.

Additionally, the insulating substrate 12 is provided with the terminal insertion holes 13 into which the terminals 38 are inserted and soldered, and the reinforcement plate 20 is arranged along an edge of the substrate exposure area 29 at which the bus bars 17A do not overlap a region on the insulating substrate 12 including the terminal through holes 13, and in which the insulating substrate 12 is exposed.

Thus, the position along the edge of the substrate exposure area 29 in which the bus bars 17A cannot overlap the insulating substrate 12, in order to be insulated from the outside, can be reinforced by the reinforcement plate 20.

Furthermore, there is a plurality of the terminals 38. The terminal module 37 is provided in which the multiple terminals 38 are connected by the connecting member 39. The connecting member 39 contacts a surface of the insulating substrate 12 opposite to the surface on which the reinforcement plate 20 is stacked.

Thus, by having the connecting member 39 for connecting multiple terminals 38 contact the insulating substrate 12, the surface of the insulating substrate 12 opposite to the surface on which the reinforcement plate 20 is stacked can be supported by the connecting member 39.

Other Embodiments

This invention is not limited to the embodiment described above with reference to the explanations and the drawings. For example, the following embodiments are also included in the technical scope of this invention.

(1) The material of the reinforcement plate 20 is the same as that of the bus bars 17A, but it can be different. For example, the reinforcement plate is not limited to metal, but can also be formed of resin.

(2) The retaining member 46 can directly retain the insulating substrate 12, the bus bars 17A, and the reinforcement plate 20, or can indirectly retain them via other members.

(3) The shape and the position for having the engagement portion 24 engage the retaining member 46 are not limited to the above embodiment. For example, an engagement portion can also be arranged at a position different from the engagement portion 24. Furthermore, it is not limited to the structure in which a protruding member such as an engagement pin is arranged, and the engagement portion 24 can also be engaged to a portion that is not protruding.

(4) The structure is used in which the insulating substrate 12 overlaps the portion in the reinforcement plate 20 that is screw-fastened by the screw 65. However, a structure can be used in which the insulating substrate 12 does not overlap the portion to be screw-fastened (edge of the through hole 22), and in which only the reinforcement plate 20 is screw-fastened to the heat-dissipating member 42. In this case as well, if the reinforcement plate 20 is fixed to the insulating substrate 12 using adhesive or the like, positioning of the insulating substrate 12 with respect to the heat-dissipating member 42 can be performed.

EXPLANATION OF THE SYMBOLS

10: Electrical junction box
11: Circuit board
12: Insulating substrate
17: Bus bar board
17A: Bus bars
20: Reinforcement plate
22: Through hole
21: Fixing portion
23: Protruding piece
24: Engagement portion
28: Engagement-receiving portion
37: Terminal module
38: Terminal
39: Connecting member
42: Heat-dissipating member
44: Receiving portion
45: Case
46: Retaining member
51: Engagement pin
52: Engagement portion
53: Screw hole
65: Screw

What is claimed is:

1. An electrical junction box, comprising:
an insulating substrate that includes a first electroconductive path formed on an insulating plate;
a bus bar that is bonded to the insulating substrate and forms a second electroconductive path;
a reinforcement plate that is bonded to a region of the insulating substrate to which the bus bar is not bonded, the reinforcement plate having formed therein a through hole that allows passage of a shaft portion of a screw;
a terminal that is soldered to the insulating substrate;
a heat-dissipating member that is stacked on a surface of the reinforcement plate opposite to the insulating substrate, the heat-dissipating member having formed therein a screw hole into which the screw is screwed; and
a retaining member that retains the respective positions of the insulating substrate, the bus bar, and the reinforcement plate, wherein:
the reinforcement plate includes an engagement portion that aligns the through hole and the screw hole by engaging with the retaining member.

2. The electrical junction box as set forth in claim 1, wherein:
the engagement portion is arranged in the vicinity of the through hole.

3. The electrical junction box as set forth in claim 1, wherein:
the engagement portion is formed as a cut-out at a periphery of the reinforcement plate.

4. The electrical junction box as set forth in claim 1, wherein:
the retaining member includes an engagement pin that engages with the engagement portion.

5. The electrical junction box as set forth in claim 4, wherein:
the heat-dissipating member includes a receiving portion through which the engagement pin passes.

6. The electrical junction box as set forth in claim 1, wherein:
the reinforcement plate includes a protruding piece that fits into the retaining member in the vicinity of the through hole.

7. The electrical junction box as set forth in claim 1, wherein:
the insulating substrate includes a terminal insertion hole into which the terminal is inserted and soldered, and
the reinforcement plate is arranged along an edge of a substrate exposure area of the insulating substrate not overlapped by the bus bar, in a region including the terminal insertion hole.

8. The electrical junction box as set forth in claim 1, wherein:
the terminal comprises a plurality of terminals, and a terminal module is included that connects the plurality of terminals by a connecting member, and
the connecting member contacts a surface of the insulating substrate opposite to a surface on which the reinforcement plate is stacked.

* * * * *